United States Patent
Xu

(10) Patent No.: US 7,961,040 B2
(45) Date of Patent: Jun. 14, 2011

(54) ACCURACY ON-CHIP CLOCK GENERATOR FOR MULTI-CLOCK DRIVEN SINGLE CHIP SOLUTION

(75) Inventor: Gang Xu, Shanghai (CN)

(73) Assignee: OmniVision International Holding, Ltd., Santa Clara, CA (US)

(*) Notice: Subject to any disclaimer, the term of this patent is extended or adjusted under 35 U.S.C. 154(b) by 312 days.

(21) Appl. No.: 12/196,349

(22) Filed: Aug. 22, 2008

(65) Prior Publication Data

US 2010/0045388 A1    Feb. 25, 2010

(51) Int. Cl.
*H03D 3/24*    (2006.01)
(52) U.S. Cl. ............... 329/318; 455/135; 455/226.3; 455/296; 375/346
(58) Field of Classification Search .......... 329/318; 455/135, 226.3, 296; 375/346
See application file for complete search history.

(56) References Cited

U.S. PATENT DOCUMENTS

| | | | |
|---|---|---|---|
| 5,752,174 A * | 5/1998 | Matai et al. ............. | 455/183.1 |
| 6,130,907 A | 10/2000 | Chen | |
| 7,250,825 B2 | 7/2007 | Wilson et al. | |
| 7,515,920 B2 * | 4/2009 | Ishihara .................. | 455/502 |
| 7,812,683 B2 * | 10/2010 | Sutardja .................. | 331/176 |
| 2002/0127967 A1 | 9/2002 | Najafi | |

FOREIGN PATENT DOCUMENTS

CN    101072029 A    11/2007

OTHER PUBLICATIONS

Cadence, White Paper, Substrate Noise Analysis of Mixed-Signal ICs, May 2001.
Sirowy, et al.; Clock-Frequency Assignment for Multiple Clock Domain Systems-on-a-Chip, 2007.

* cited by examiner

*Primary Examiner* — Robert Pascal
*Assistant Examiner* — James E Goodley
(74) *Attorney, Agent, or Firm* — Blakely Sokoloff Taylor & Zafman LLP

(57) ABSTRACT

A mixed-signal chip is described. The mixed-signal chip comprises a first portion of analog circuit and second portion of digital circuit, an on-chip precision oscillator residing on the first analog portion, the precision oscillator has a precision frequency; a first on-chip non-precision tunable oscillator from a first clock domain residing on the first analog portion, the first non-precision tunable oscillator has a first adjustable frequency; a noise detector for detecting a first noise in the first clock domain; a frequency adjusting register for storing a first desired frequency value of the first on-chip non-precision tunable oscillator, wherein the first desired frequency value is determined based on the first detected noise; a control circuit for adjusting the adjustable frequency of the first non-precision tunable oscillator to the first desired frequency value by using the precision frequency of the on-chip precision oscillator as a reference.

26 Claims, 5 Drawing Sheets

ACCURACY ON-CHIP CLOCK GENERATOR FOR MULTI-CLOCK DRIVEN SINGLE CHIP SOLUTION

CROSS REFERENCE TO RELATED APPLICATIONS

Not Applicable.

STATEMENT REGARDING FEDERALLY SPONSORED RESEARCH

Not Applicable.

FIELD OF THE INVENTION

This description relates generally to on-chip non-precision tunable oscillator calibration and more particularly, the description relates to on-chip non-precision tunable oscillator calibration to avoid adverse impact of noise on analog circuit in a mixed-signal integrated circuit chip.

SUMMARY

In general, in one aspect, the invention features a mixed-signal chip which has a first portion of analog circuit and second portion of digital circuit. The mixed-signal chip comprises an on-chip precision oscillator residing on the first analog portion, the precision oscillator has a precision frequency; a first on-chip non-precision tunable oscillator from a first clock domain residing on the first analog portion, the first non-precision tunable oscillator has a first adjustable frequency; a noise detector for detecting a first noise in the first clock domain; a frequency adjusting register for storing a first desired frequency value of the first on-chip non-precision tunable oscillator, wherein the first desired frequency value is determined based on the first detected noise; a control circuit for adjusting the adjustable frequency of the first non-precision tunable oscillator to the first desired frequency value by using the precision frequency of the on-chip precision oscillator as a reference.

Implementation of the invention may include one or more of the following features. The noise detector in the mixed-signal chip is a RSSI (Receive Signal Strength Indicator) detector. The RSSI detector detects the noise by calculating a signal quality metric of a signal of the first clock domain. The signal quality metric is BER or a statistics of a RSSI signal over time. The mixed-signal chip comprise a second on-chip non-precision oscillator from a second clock domain residing on the first analog portion, the second non-precision oscillator has a second adjustable frequency, wherein the control circuit further adjusts the second adjustable frequency to a second desired frequency, the adjusting is based on the precision frequency of the on-chip precision oscillator. The mixed-signal comprises a second noise detector which detects a second noise in the second clock domain, and the second desired frequency value is determined based on the second detected noise. The control circuit shuts down the on-chip precision oscillator after the first adjustable frequency is adjusted to the first desired frequency value and the second adjustable frequency is adjusted to the second desired frequency value. The noise is coupled from operation of the second portion digital circuit or from power ripple in a power supply line supplying power to the chip or is EMI or from multipath fading in signal transmission path in the first analog portion. The noise detector in the mixed-signal chip detects the noise which has a noise frequency, and the control circuit adjusts the first adjustable frequency to a frequency different from the noise frequency. The first clock domain comprises a RF circuit having an IF (intermediate frequency) signal with frequency controllable by the first on-chip non-precision tunable oscillator, wherein the noise detector detects the noise having a noise frequency, wherein the control circuit adjusts the first adjustable frequency such that the frequency of the IF signal is different from the noise frequency. The mixed-signal chip conforms to a communication standard, and the communication standard has a plurality of transmission frequencies which can be used for communication, the first desired frequency value is determined as one of the plurality of transmission frequencies. The communication standard is chosen from the group consisting of Bluetooth, WiFi, and GSM. The mixed-signal chip, which comprises two clock domains, the first clock domain communicates with the second clock domain via an unsynchronized interface.

In general, in another aspect, the invention features a method for reducing noise in analog portion of a mixed-signal chip, the mixed-signal chip further comprises a digital portion sharing a common substrate with the analog portion, an on-chip precision oscillator residing on the first analog portion for providing a precision frequency; a first on-chip non-precision tunable oscillator from a first clock domain residing on the first analog portion for providing a first adjustable frequency to the first clock domain. The method comprises detecting a first noise in the first clock domain; determining a first desired frequency value of the first on-chip non-precision tunable oscillator when the detected noise is over a threshold value; adjusting the first non-precision tunable oscillator to the first desired frequency value by using the precision frequency of the on-chip precision oscillator as a reference.

Implementation of the invention may include one or more of the following features. The detecting is based on a RSSI detector which calculates a signal quality metric of a signal of the first clock domain. The mixed-signal chip further comprises a second on-chip non-precision oscillator from a second clock domain residing on the first analog portion, the second non-precision oscillator has a second adjustable frequency, and the method comprises adjusting the second adjustable frequency to a second desired frequency, the adjusting is based on the precision frequency of the on-chip precision oscillator. The method shuts down the on-chip precision oscillator after the first adjustable frequency is adjusted to the first desired frequency value and the second adjustable frequency is adjusted to the second desired frequency value. The detected noise has a noise frequency, the method comprises adjusting the first adjustable frequency to a frequency different from the noise frequency. The first clock domain comprises a RF circuit having an IF (intermediate frequency) signal with frequency controllable by the first on-chip non-precision tunable oscillator, and the detected noise has a noise frequency, the method comprises adjusting the first adjustable frequency such that the frequency of the IF signal is different from the noise frequency. The mixed-signal chip conforms to a communication standard, and the communication standard has a plurality of transmission frequencies which can be used for communication, the method comprises determining the first desired frequency value by selecting it as one of the plurality of transmission frequencies. The communication standard is chosen from the group consisting of Bluetooth, WiFi, and GSM. The first clock domain communicates with the second clock domain via an unsynchronized interface.

BRIEF DESCRIPTION OF THE DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Reference will now be made in detail to certain embodiments of the invention, one or more examples of which are illustrated in the accompanying drawings. Each example is provided by way of explanation of the invention, not limitation of the invention. It will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations that come within the scope of the present disclosure, including the appended claims.

Figure 1:
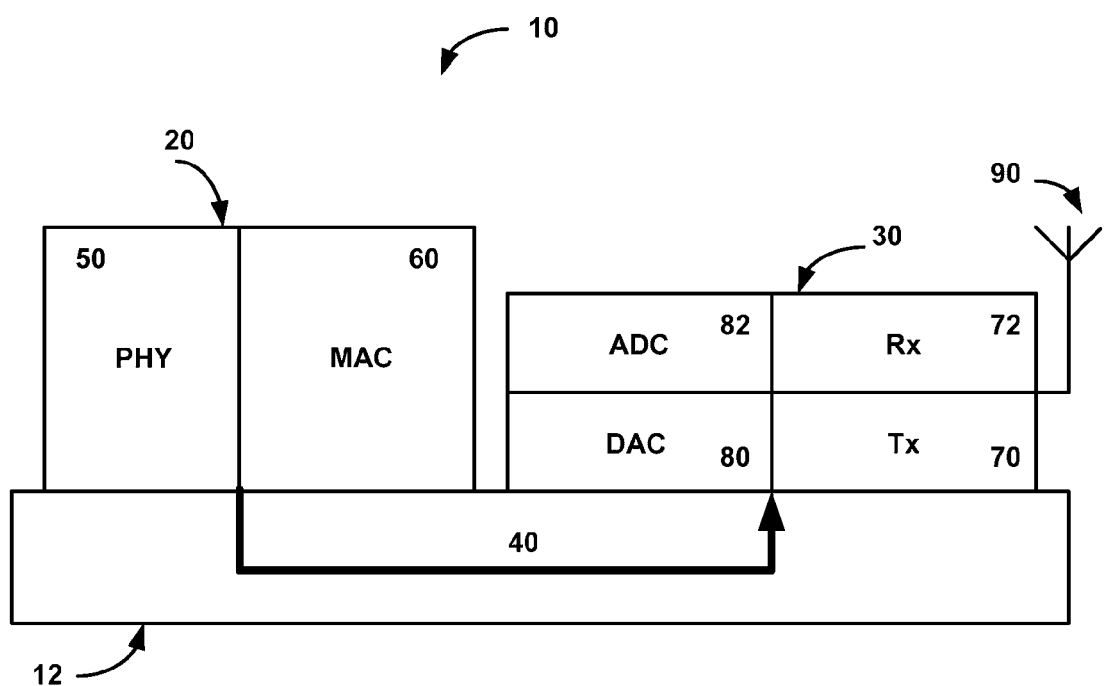
FIG. 1 illustrates substrate noise coupling for a mixed-signal chip.

CMOS technology has enabled integration of multiple electronic circuits, including analog and digital circuits, into a single silicon die. It is possible now to implement multiple subsystems into a single integrated circuit chip (IC). FIG. 1 shows a mixed-signal chip (an IC or system on a chip (SoC)) 10 which comprises a digital portion 20 and an analog portion 30. Digital circuits in the digital portion 20 share a common substrate (silicon die) 12 with analog circuits in the analog portion 30. An example as shown, the digital portion includes a digital physical layer (PHY) 50 and a media access controller (MAC) 60. The analog portion includes a transmitter (Tx) 70, a receiver (Rx) 72, a digital-to-analog converter (DAC) 80 and an analog-to-digital converter (ADC) 82. The mixed-signal chip 10 communicates wirelessly with outside world through an antenna 90. It should be understood however, that while the specific example for the digital and/or analog circuits is described herein, this is for exemplary purposes only and the description is applicable to any mixed-signal chip in which, for example, the analog portion may comprises a RF receiver, a modem, a baseband processing block or any other signal processing blocks and any combination of them.

In a mixed signal chip, signals are processed both in the digital and the analog domain on the same chip. The analog circuits which are more sensitive are subject to interference from a wide variety of noise sources. For example, when a digital circuit is operating, a large number of nodes rapidly switch which generate current ripples and voltage fluctuations in the power supply lines. The power line ripples can result in degraded performance or malfunction of the sensitive analog circuits. Furthermore, since the analog portion and the digital portion shares a common substrate, the noise caused by digital circuits switching is injected into the silicon substrate 12 and is spread (40) through the substrate to the analog circuits in the analog portion 30.

The analog circuits are also subject to typical analog device noise sources such as thermal, flicker, shot noise and EMI (Electromagnetic Interference) although these noise sources are generally much smaller than noise caused by substrate noise coupling and power ripples. Transmission path induced noises, for example, multipath fading which happens when a transmitted signal follows multiple paths to a received as a result of the transmitted signal reflecting off buildings, aggressive terrain, and other obstacles, can also degrade the performance of the analog circuits.

Thus for an analog circuit, for example, a commonly used PLL (phase-locked loop) in analog circuitry such as a VCO (voltage controlled oscillator) controlled PLL oscillator, noise, which is commonplace and unavoidable in the harsh mixed-signal environment as described above, can introduce time-varying offsets in the phase of the output clock from its ideal value, if a PLL does not respond well to noise. These time-varying offsets in the output-clock phase are commonly referred to as jitter. Jitter can have disastrous effects on internal timing paths by causing setup-time violations, and can affect off-chip interfaces by causing setup-and-hold-time violations that lead to data transmission errors.

Figure 2:
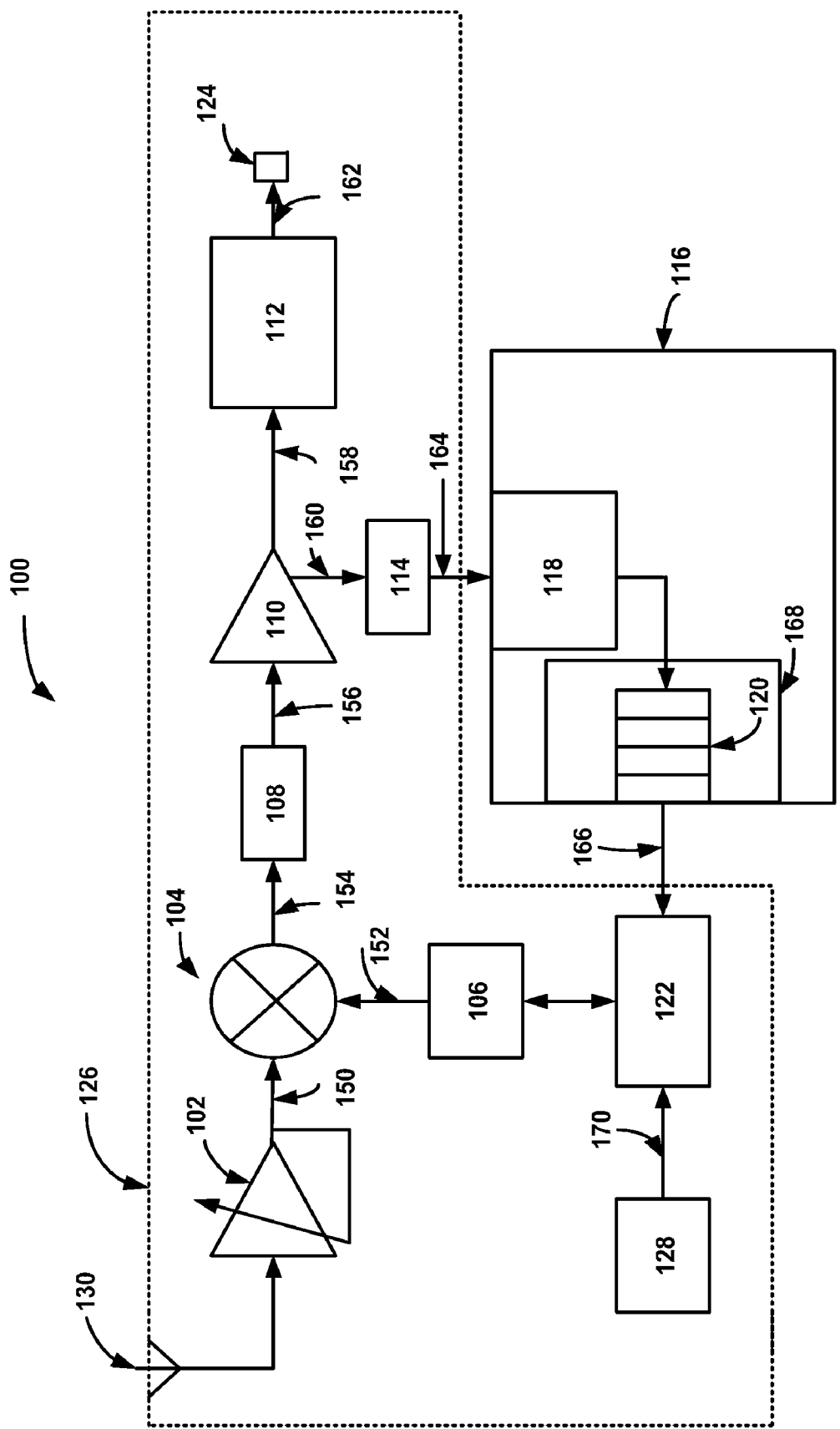
FIG. 2 illustrates a mixed-signal chip.

FIG. 2 shows an example of a mixed-signal chip 100. The mixed-signal chip includes a RF analog portion 126 (dotted line) and a digital portion 116. The RF analog portion 126 illustrates a RF receiver having a superheterodyne architecture. RF signal is received via an antenna 130 and its magnitude is adjusted by an automatic gain control (AGC) 102. The adjusted RF signal 150 is fed to a mixer 104 where it mixes with a carrier frequency signal 152 from a non-precision tunable oscillator 106 to generate an intermediate frequency (IF) signal 154. The IF signal is then filtered, for example, by a bandpass filter centered at the RF frequency signal of interest, to generate a filtered signal 156 and it is subsequently amplified by an amplifier 110 to provide a amplified signal 158. The amplified signal 158 is sent to a bassband processing circuit 112 where it is, for example, demodulated, and the output 162 is then fed to an output device 124, for example, a microphone or a speaker. A portion of amplified signal 160 is converted to a DC level to produce Received Signal Strength Indicator (RSSI) signal which is further quantized by an ADC 114 and the quantized digital samples 164 is sent to a micro controller (MCU) 116 for further processing. Methods for providing a RSSI signal should be understood in this art and are therefore not described in detail herein.

In one example, the micro controller (MCU) 116 includes a RSSI noise processor 118 which, based on the RSSI signal from ADC 114, determines the strength of the signal of interest in the analog portion 126, as described in more detail below. The micro controller (MCU) 116 issues a RSSI event if the noise level is large enough. In one example, the strength of the signal of interest is compared with and its peak value. If the difference is greater than a threshold value, micro controller (MCU) 116 will issue a RSSI event and generates a desired frequency to which the carrier frequency of the non-precision tunable oscillator 106 will be adjusted. The generated desired frequency value is stored in a desired frequency setting register 120 in a digital memory unit 168. The digital memory unit 168 can be, such as, an electrically erasable programmable ROM (EEPROM), a one-time programmable (OTP), or a multi-time programmable (MTP) memory. The desired frequency value 166 is provided to an oscillator control unit 122, as described in more detail below, which adjusts the adjustable carrier frequency of the non-precision tunable oscillator to the desired frequency value by using a precision frequency signal 170 from an on-chip precision oscillator 128 as a reference clock and time base. The on-chip precision oscillator 128 is a crystal oscillator connected to an external crystal which provides a reference precision stable time base.

The noise level in the analog portion 126 can be continuously monitored, for example, by detecting the strength of the signal of interest using a RSSI detector, and the adjustable carrier frequency of the non-precision tunable oscillator 106 can be accordingly adjusted to a desired frequency until the noise level in the analog portion 126 is reduced to an acceptable level, thus avoid noise interference and improves received signal quality, for example, with improved SNR or with peaked strength of the signal of interest. The noise in the analog portion can be induced by a noise frequency from various noise sources such as due to digital circuit switching as described above when the noise spectrum overlaps with the carrier frequency and/or IF frequency and their harmonics. Thus, to achieve high quality analog signal transmission, it is desirable to adjust the carrier frequency of the non-precision tunable oscillator 106 such that the carrier frequency and/or IF frequency is different from the noise frequency.

While the example of FIG. 2 shows a specific analog portion and a specific digital portion. The description is applicable to any digital and/or analog portion implementations. For example, the analog portion can include a transmitter in addition to the shown RF receiver, a modem, other signal processing circuits and any combination of them. The RF receiver can be based on architectures other than superheterodyne such as one based on an in-phase and quadrature phase processing technique. The non-precision tunable oscillator 106 can be one of many forms such as a RC oscillator, a LC oscillator or a VCO (voltage controlled oscillator) controlled PLL oscillator. In the digital portion 116, the RSSI noise processor 118, the digital memory unit 168 including the desired frequency setting register 120 can be formed in a single circuitry or multiple separated circuitries.

The RSSI noise processor 118 determines noise level in the analog portion 126 by detecting the strength of the signal of interest. In one example, the RSSI noise detector 118 calculates a signal quality metric such as Bit Error Rate (BER) of the signal of interest. The noise level can also be determined by calculating various statistics of the RSSI signal over time such as average and variance, and compare calculated statistics to a threshold value. If the calculated signal quality such as the BER or the statistics is over a threshold value which may be in the form of an interval with an upper bound value and a lower bound value, the micro controller (MCU) 116 will issue a RSSI event and determine a desired frequency value. In one example, the desired frequency value can be determined by simply incrementing, either plus (+) or minus (-), the determined frequency of the non-precision tunable oscillator 106 until the calculated signal quality metric reaches its peak value.

In some examples, the mixed-signal chip 100 performs communication function which conforms to a communication standard, for example, Bluetooth, WiFi, and GSM. Certain standard has a plurality of transmission frequencies which can be used for communication. The desired frequency value can be determined by picking a frequency from the plurality of frequencies.

Figure 3:
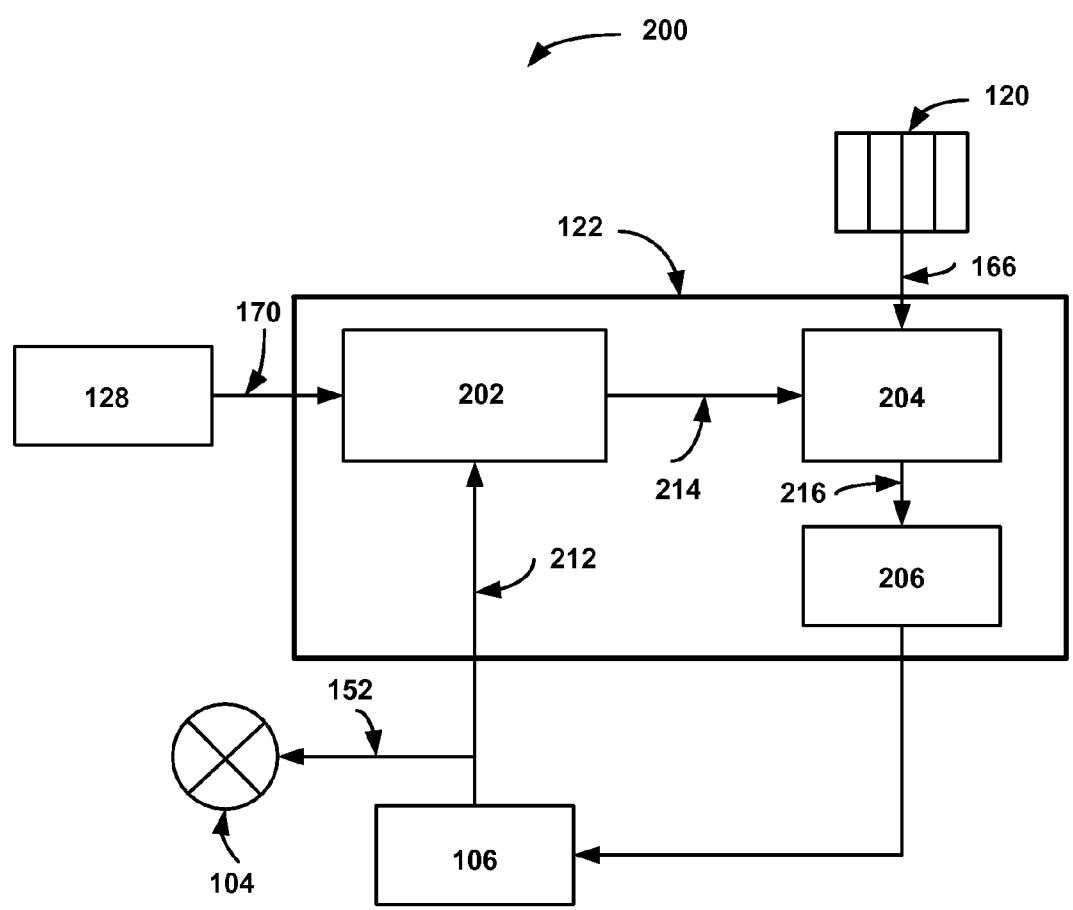
FIG. 3 illustrates an implementation of the frequency control unit in FIG. 2.

FIG. 3 shows further details of an example implementation 200 of the oscillator control unit 122. When the micro controller (MCU) 116 issues a RSSI event, the oscillator control unit 122 takes, as input, the carrier frequency signal 212 of the output of the non-precision tunable oscillator 106. A timer/counter 202 is used to determine the frequency of the non-precision tunable oscillator 106 by employing the reference precision frequency signal 170 from the on-chip precision oscillator 128 as a reference time base. Methods for implementing the timer/counter 202 should be understood in this art and are therefore not described in detail herein.

The determined frequency 214 of the non-precision tunable oscillator 106 is compared, in a comparator 204, with the determined desired frequency value 166. The comparison result will be provided as a signal 216 to a frequency calibration unit 206 which will then adjust the non-precision tunable oscillator 106 so that the frequency of the non-precision tunable oscillator 106 is the same as the desired frequency value. The output 152 the non-precision tunable oscillator 106 with adjusted frequency will be provided to the mixer 104. The way how the non-precision tunable oscillator 106 can be adjusted depends on the specific structure of the non-precision tunable oscillator 106. For example, for a VCO (voltage controlled oscillator) controlled PLL oscillator 106, the supply voltage to VCO can be controlled to adjust the frequency. It should be understood that FIG. 3 illustrates one exemplary implementation of the oscillator control unit 122 that this is for purposes of example only, and one skilled in the art should understand from the present disclosure that the oscillator control unit 122 can be accomplished in a wide variety of different approaches. For example, the comparator 204 can be implemented in analog portion instead of the digital portion as shown in FIG. 3. The frequency calibration unit 206 can also be accomplished in analog and/or digital domains.

Figure 4:
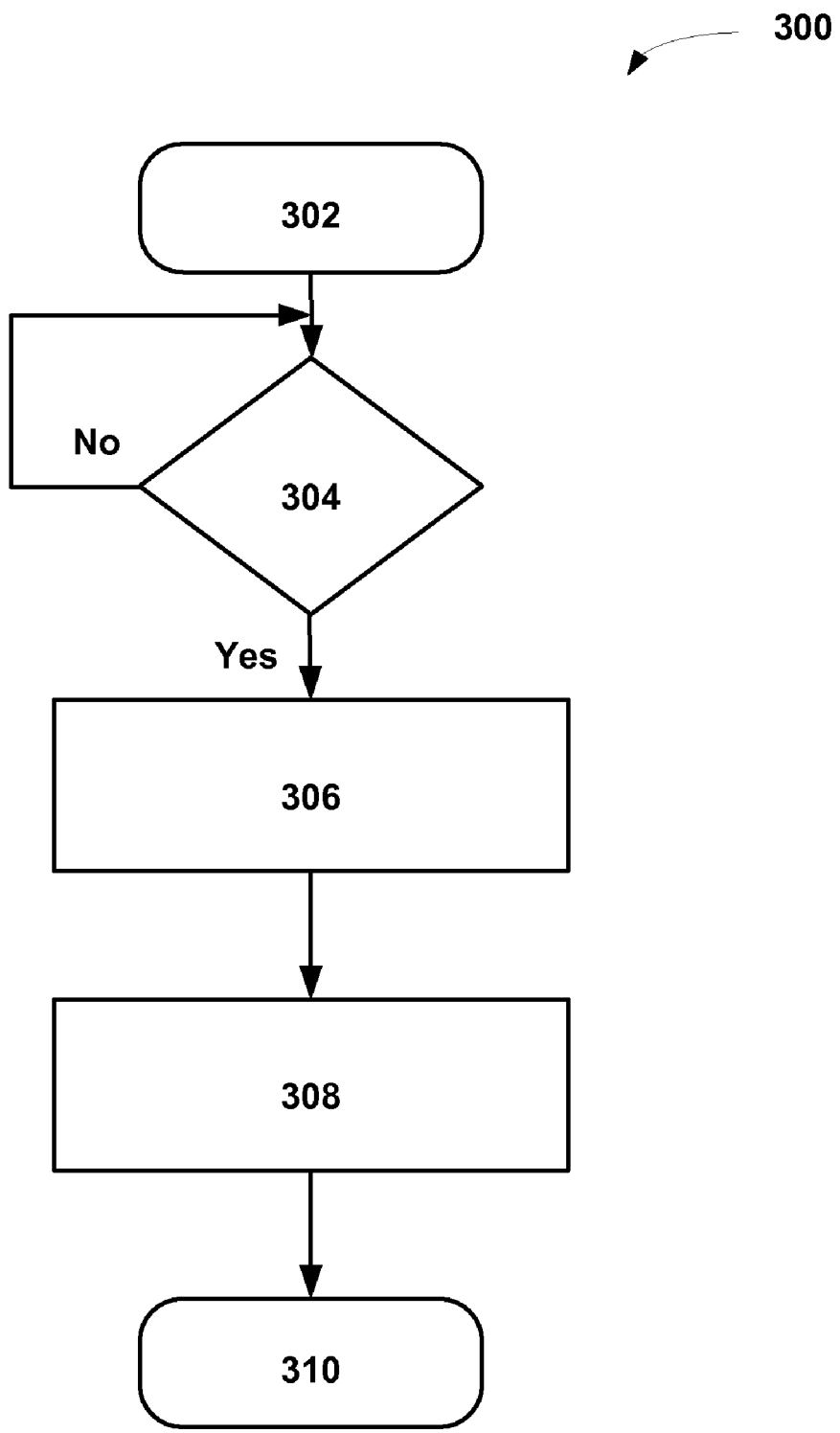
FIG. 4 illustrates a noise detection based frequency adjustment procedure.

FIG. 4 illustrates a noise detection based frequency adjustment procedure 300. The procedure starts (302) by monitoring whether a RSSI event has been issued by the micro controller (MCU) (304). If no RSSI event yet, the procedure loops back to continue monitoring. Otherwise, the procedure retrieves the desired frequency value 166 (FIG. 3) determined in RSSI noise processor 118 and provides a reference time base 170 (FIG. 3) from the on-chip precision oscillator 128 (306). The procedure then proceeds to determine the frequency of the non-precision tunable oscillator 106 based on the reference time base (FIG. 3), compares it (214 of FIG. 3) with the desired frequency value 166, and adjusts the non-precision tunable oscillator so that its frequency conforms to the desired frequency value (308). The procedure then ends (310). It shout be noted that while in the example, the desired frequency value is chosen as a direct measure of the frequency of the non-precision tunable oscillator 106, the desired frequency value can also be chosen as an indirect measure of the frequency of the non-precision tunable oscillator 106, such as the IF frequency 154 (FIG. 2). In this case, the non-precision tunable oscillator 106 is adjusted so that the IF frequency conforms to the desired frequency value.

Figure 5:
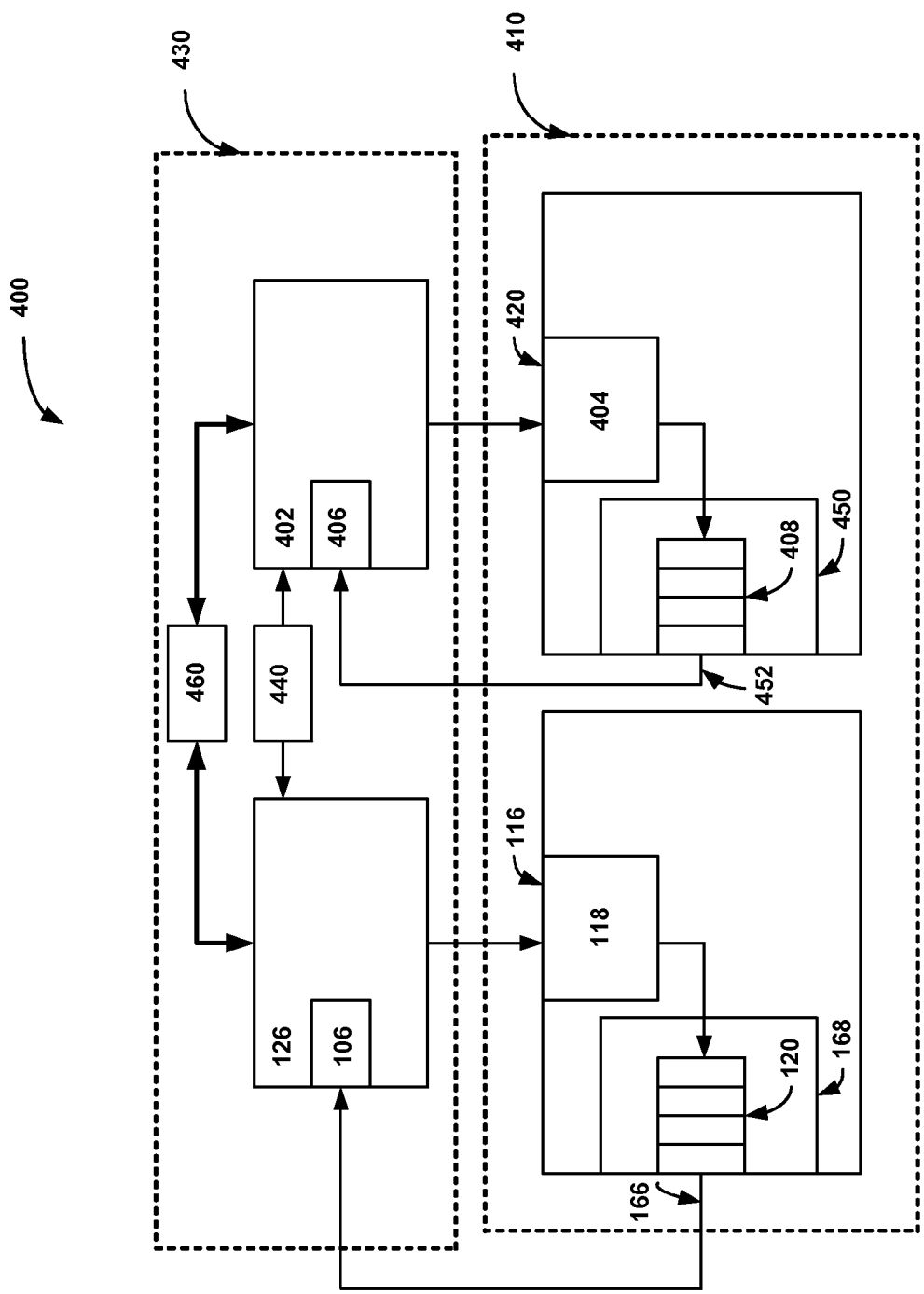
FIG. 5 a multiple clock domain mixed-signal chip

FIG. 5 shows a mixed-signal chip 400 which comprises a digital portion 410 and an analog portion 430. Differing from the mixed-signal chip in FIG. 2, the analog portion 430 of the mixed-signal chip 400 includes a first clock domain 126 which, as an example, is the same as the RF receiver 126 of FIG. 2. The analog portion 430 of the mixed-signal chip 400 also includes a second clock domain 402 which, by way of example, can be a modem, a baseband processing block or other signal processing blocks. The block of circuitry in the first clock domain 126 operates at a clock frequency provided by a first local non-precision tunable oscillator 106, and the block of circuitry in the second clock domain 402 operates at a clock frequency provided by a second local non-precision tunable oscillator 406. By way of example, the same micro controllers MCU) in FIG. 2 is illustrated in FIG. 5 (116 and 420). An on-chip precision oscillator 440 provides a reference time base to both the first clock domain 126 and the second clock domain 402. The reference time base is utilized by the micro controllers 116 and 420 to adjust the frequency of the first local non-precision tunable oscillator 106 and the frequency of the second local non-precision tunable oscillator 406 as described before. Different functionalities of the first clock domain 126 and the second clock domain 402 may require different clock frequencies from the first local non-precision tunable oscillator 106 and the second local non-precision tunable oscillator 406.

A first RSSI noise processor 118 and a second RSSI noise processor 404 process the quantized RSSI samples for the first clock domain 126 and the second clock domain 402 respectively. The detected noise levels in the first and second clock domains 126 and 402 respectively will be utilized to determine a first desired frequency value 166 and a second desired frequency value 452 which are stored in the first desired frequency setting register 120 and a second desired frequency setting register 408 in a first digital memory unit 168 and a second digital memory unit 450.

Existing multiple-clock domain chip requires a precision reference clock signal to be continuously distributed to the chip and the precision reference clock signal can not be shut down. In the present disclosure, since the local clock oscillator for each clock domain can be adjusted after being triggered by an event such as a RSSI event as described above or a power-on event, the on-chip precision reference clock can be shut down after adjustment. Thus one advantage of the description herein is that after the frequencies of the local non-precision tunable oscillators have been finished, the common on-chip precision oscillator 440 can be shut down without requiring it to continue running to reduce power consumption. It should also be noted that FIG. 5 shows a specific implementation of the analog and the digital portions for purposes of example only, and one skilled in the art should understand that the analog and/or digital portion can be accomplished in numerous ways. For example, a single micro controller can be implemented instead of the two as shown. A single RSSI noise processor can be used for both clock domains. The number of clock domains is not limited to two and there may be more than two clock domains. The first clock domain communicates with the second clock domain via an interface 460 which allows different clock frequencies being used in different clock domains. In one example, interface 460 is SPI (Serial Peripheral Interface).

While the description has been particularly shown and described with reference to specific exemplary embodiments, it is evident that those skilled in the art may now make numerous modifications of, departures from and uses of the specific apparatus and techniques herein disclosed. Consequently, other implementations are also within the scope of the following claims.

What is claimed is:

1. A mixed-signal chip having a first portion of analog circuitry and second portion of digital circuitry, the chip comprises:
   an on-chip precision oscillator residing on the first analog portion, the precision oscillator has a precision frequency;
   a first on-chip non-precision tunable oscillator from a first clock domain residing on the first analog portion, the first non-precision tunable oscillator has a first adjustable frequency;
   a noise detector for detecting a first noise in the first clock domain;
   a frequency adjusting register for storing a first desired frequency value of the first on-chip non-precision tunable oscillator, wherein the first desired frequency value is determined based on the first noise;
   a control circuit for adjusting the first adjustable frequency of the first non-precision tunable oscillator to the first desired frequency value by using the precision frequency of the on-chip precision oscillator as a reference;
   a second on-chip non-precision oscillator from a second clock domain residing on the first analog portion, the second non-precision oscillator having a second adjustable frequency, wherein the control circuit is further coupled to adjust the second adjustable frequency to a second desired frequency based on the precision frequency of the on-chip precision oscillator; and
   a second noise detector which detects a second noise in the second clock domain, wherein the second desired frequency is determined based on the second detected noise.

2. The mixed-signal chip of claim 1 wherein the noise detector is a RSSI (Receive Signal Strength Indicator) detector.

3. The mixed-signal chip of claim 2 wherein the RSSI detector detects the noise by calculating a signal quality metric of a signal of the first clock domain.

4. The mixed-signal chip of claim 3 wherein the signal quality metric is BER.

5. The mixed-signal chip of claim 3 wherein the signal quality metric is a statistics of a RSSI signal over time.

6. The mixed-signal chip of claim 1 wherein the control circuit shuts down the on-chip precision oscillator after the first adjustable frequency is adjusted to the first desired frequency value and the second adjustable frequency is adjusted to the second desired frequency value.

7. The mixed-signal chip of claim 1 wherein the noise is coupled from operation of the second portion digital circuit.

8. The mixed-signal chip of claim 1 wherein the noise is from power ripple in a power supply line supplying power to the chip.

9. The mixed-signal chip of claim 1 wherein the noise is EMI.

10. The mixed-signal chip of claim 1 wherein the noise is from multipath fading in signal transmission path in the first analog portion.

11. The mixed-signal chip of claim 1 wherein the noise detector detects the noise having a noise frequency, the control circuit adjusts the first adjustable frequency to a frequency different from the noise frequency.

12. The mixed-signal chip of claim 1 wherein the first clock domain comprises a RF circuit having an IF (intermediate frequency) signal with frequency controllable by the first on-chip non-precision tunable oscillator, wherein the noise detector detects the noise having a noise frequency, wherein the control circuit adjusts the first adjustable frequency such that the frequency of the IF signal is different from the noise frequency.

13. The mixed-signal chip of claim 1 conforms to a communication standard, wherein the communication standard has a plurality of transmission frequencies which can be used for communication, the first desired frequency value is determined as one of the plurality of transmission frequencies.

14. The mixed-signal chip of claim 13 wherein the communication standard is chosen from the group consisting of Bluetooth, WiFi, and GSM.

15. The mixed-signal chip of claim 1 wherein the first clock domain communicates with the second clock domain via an unsynchronized interface.

16. A method for reducing noise in analog portion of a mixed-signal chip, wherein the mixed-signal chip comprises a digital portion sharing a common substrate with the analog portion, an on-chip precision oscillator residing on the first analog portion for providing a precision frequency, a first on-chip non-precision tunable oscillator from a first clock domain residing on the first analog portion for providing a first adjustable frequency to the first clock domain, and a second on-chip non-precision oscillator from a second clock domain residing on the first analog portion, the second non-precision oscillator having a second adjustable frequency, the method comprises:

detecting a first noise in the first clock domain;

determining a first desired frequency value of the first on-chip non-precision tunable oscillator when the detected noise is over a threshold value;

adjusting the first non-precision tunable oscillator to the first desired frequency value by using the precision frequency of the on-chip precision oscillator as a reference; and adjusting the second adjustable frequency to a second desired frequency, the adjusting based on the precision frequency of the on-chip precision oscillator, wherein the mixed-signal chip further comprises a second noise detector, the method further comprising detecting a second noise in the second clock domain, wherein the second desired frequency is determined based on the second detected noise.

17. The method of claim 16 wherein detecting is based on a RSSI detector which calculates a signal quality metric of a signal of the first clock domain.

18. The method of claim 16 wherein the method shuts down the on-chip precision oscillator after the first adjustable frequency is adjusted to the first desired frequency value and the second adjustable frequency is adjusted to the second desired frequency value.

19. The method of claim 16 wherein the detected noise has a noise frequency, the method comprises adjusting the first adjustable frequency to a frequency different from the noise frequency.

20. The method of claim 16 wherein the first clock domain comprises a RF circuit having an IF (intermediate frequency) signal with frequency controllable by the first on-chip non-precision tunable oscillator, wherein the detected noise has a noise frequency, the method comprises adjusting the first adjustable frequency such that the frequency of the IF signal is different from the noise frequency.

21. The method of claim 16 wherein the mixed-signal chip conforms to a communication standard, wherein the communication standard has a plurality of transmission frequencies which can be used for communication, the method comprises determining the first desired frequency value by selecting it as one of the plurality of transmission frequencies.

22. The method of claim 21 wherein the communication standard is chosen from the group consisting of Bluetooth, WiFi, and GSM.

23. The method of claim 18 wherein the first clock domain communicates with the second clock domain via an unsynchronized interface.

24. The mixed-signal chip of claim 1, wherein the control circuit is coupled to shut down the on-chip precision oscillator after the adjustable frequency is adjusted to the desired frequency value.

25. The method of claim 16, further comprising:

shutting down the on-chip precision oscillator after the first adjustable frequency is adjusted to the first desired frequency value.

26. A mixed-signal chip having a first portion of analog circuitry and second portion of digital circuitry, the chip comprises:

an on-chip precision oscillator residing on the first analog portion, the precision oscillator has a precision frequency;

a first on-chip non-precision tunable oscillator from a first clock domain residing on the first analog portion, the first non-precision tunable oscillator has a first adjustable frequency;

a noise detector for detecting a first noise in the first clock domain;

a control circuit for adjusting the first adjustable frequency of the first non-precision tunable oscillator to a first desired frequency value by using the precision frequency of the on-chip precision oscillator as a reference, wherein the first desired frequency value is determined based on the first noise;

a second on-chip non-precision oscillator from a second clock domain residing on the first analog portion, the second non-precision oscillator having a second adjustable frequency, wherein the control circuit is further coupled to adjust the second adjustable frequency to a second desired frequency based on the precision frequency of the on-chip precision oscillator; and a second noise detector which detects a second noise in the second clock domain, wherein the second desired frequency value is determined based on the second detected noise.

\* \* \* \* \*